(12) United States Patent
Liu et al.

(10) Patent No.: US 9,276,530 B1
(45) Date of Patent: Mar. 1, 2016

(54) ADVANCED CURRENT LIMIT FUNCTION FOR AUDIO AMPLIFIER

(71) Applicant: STMicroelectronics (Shenzhen) R&D Co. Ltd, Shenzhen (CN)

(72) Inventors: Qi Yu Liu, Shenzhen (CN); Ru Feng Du, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 0 days.

(21) Appl. No.: 14/487,313

(22) Filed: Sep. 16, 2014

(30) Foreign Application Priority Data

Aug. 29, 2014 (CN) .......................... 2014 1 0436485

(51) Int. Cl.
*H03F 3/217* (2006.01)
*H03F 1/52* (2006.01)
*H02H 3/08* (2006.01)
*H03F 3/183* (2006.01)

(52) U.S. Cl.
CPC . *H03F 1/52* (2013.01); *H02H 3/08* (2013.01); *H03F 3/183* (2013.01); *H03F 3/217* (2013.01); *H03F 2200/462* (2013.01)

(58) Field of Classification Search
USPC ........................................ 330/251, 207 P, 10
IPC ...................................................... H03F 3/217
See application file for complete search history.

(56) References Cited

U.S. PATENT DOCUMENTS

| 6,229,389 | B1 | 5/2001 | Pullen et al. | |
|---|---|---|---|---|
| 7,463,469 | B2 | 12/2008 | Jacobs | |
| 2006/0186955 | A1* | 8/2006 | Quilter | H03F 1/32 330/10 |
| 2006/0262473 | A1* | 11/2006 | Neesgaard | H03F 1/52 361/93.1 |
| 2009/0174485 | A1* | 7/2009 | Teng | H03F 1/523 330/298 |
| 2011/0267731 | A1 | 11/2011 | Amadi et al. | |
| 2011/0304400 | A1* | 12/2011 | Stanley | H03F 1/26 330/295 |
| 2013/0089223 | A1* | 4/2013 | Heineman | H03F 1/26 381/120 |

* cited by examiner

*Primary Examiner* — Patricia T Nguyen
(74) *Attorney, Agent, or Firm* — Gardere Wynne Sewell LLP

(57) ABSTRACT

A class-D audio amplifier incorporates an overcurrent protection scheme implementing two overcurrent thresholds to avoid a dynamic impedance drop. When output current reaches the first threshold as a result of an impedance drop across the speaker, the overcurrent protection circuitry limits the output current to the value of the first threshold, but does not shut down the circuit. The second threshold is used to detect an overcurrent condition to shut down the circuit. Current limiting logic of a first channel monitors the overcurrent condition of a second channel and controls the first channel output in response thereto. This permits the second channel output current to reach the second threshold if the circuit is experiencing a short-circuit condition. This scheme also allows the output current to drop below the first threshold if the overcurrent condition of the second channel is caused by an impedance drop across the output speaker.

20 Claims, 11 Drawing Sheets

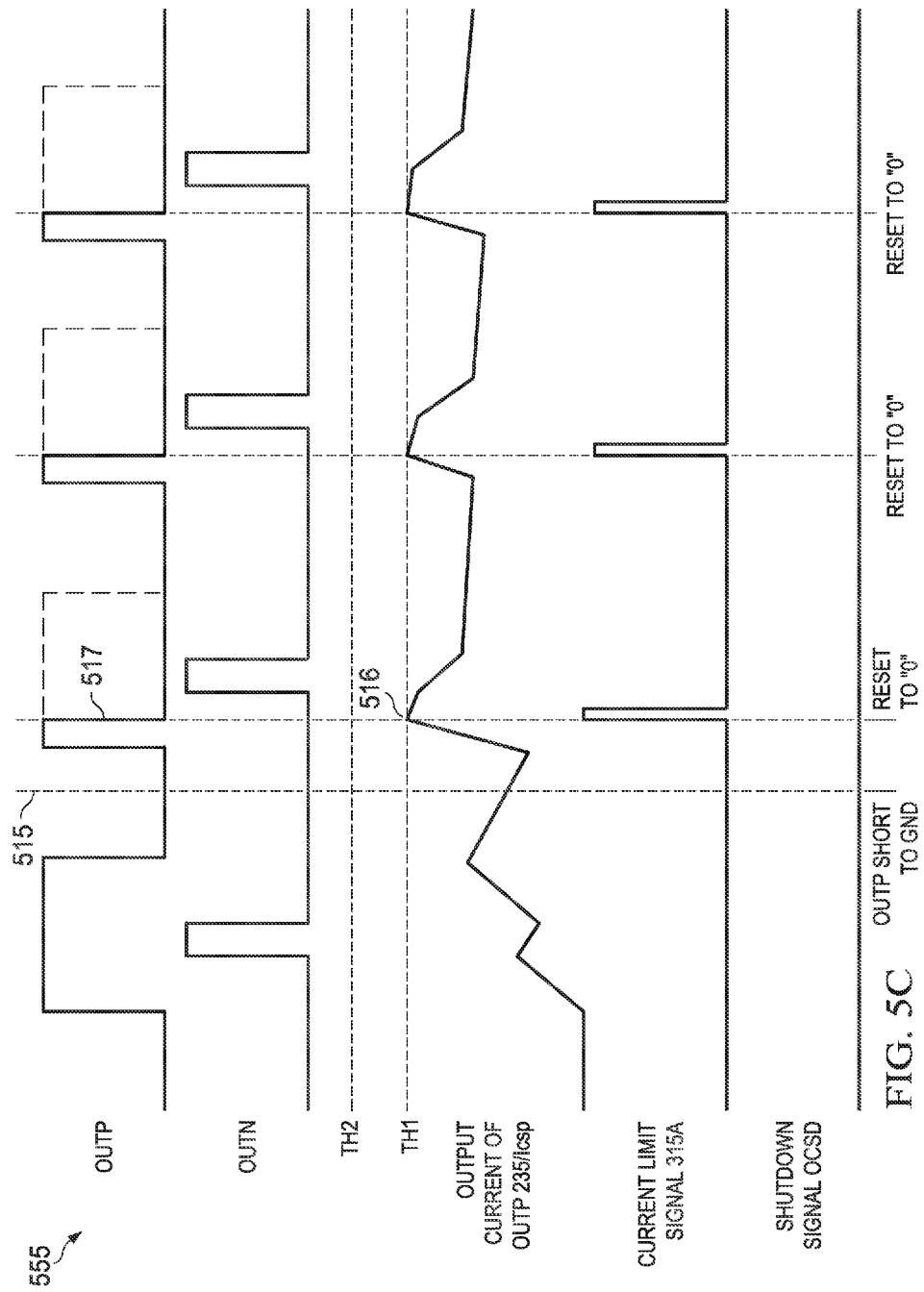

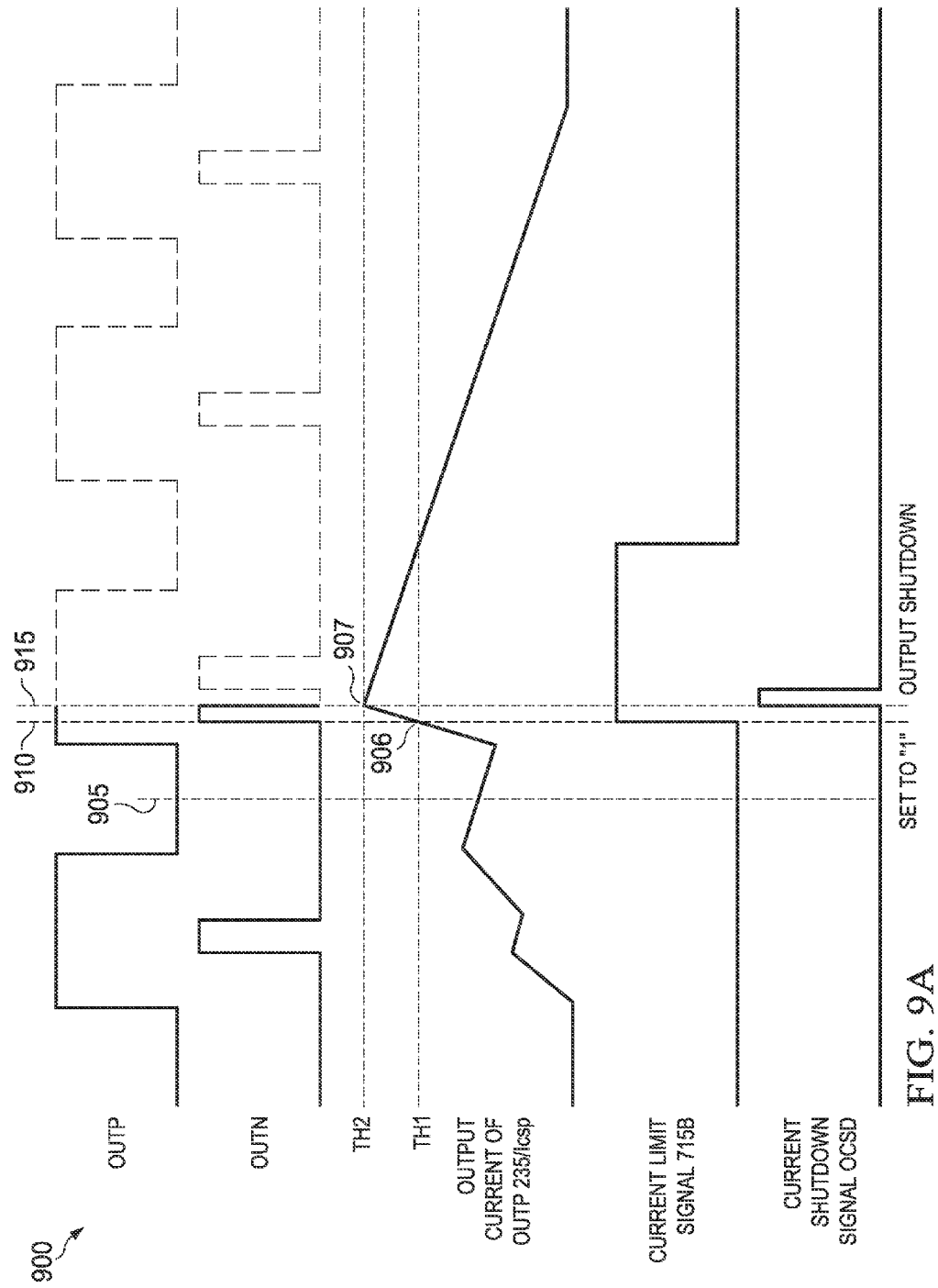

US 9,276,530 B1

ADVANCED CURRENT LIMIT FUNCTION FOR AUDIO AMPLIFIER

CROSS-REFERENCE TO RELATED APPLICATIONS

Pursuant to 35 U.S.C. §119(a)-(d), this application claims the priority of Chinese Patent Application Serial No. 201410436485.9, filed Aug. 29, 2014, which is hereby incorporated by reference in its entirety for all purposes.

TECHNICAL FIELD

The present disclosure generally relates to overcurrent protection for audio amplifier circuitry and, more particularly, to a system and method for providing a current limit function to provide overcurrent protection of a bridge-tied load (BTL) class D audio amplifier.

BACKGROUND

Overcurrent protection is often implemented in class-D audio amplifiers, also known as switching amplifiers, to protect the system and connected components from damage that occurs from overcurrent conditions. FIGS. 1A and 1B illustrate an example embodiment of components comprising a typical class-D audio amplifier circuit 100, including switching amplifiers 102, low-pass filters 104, and output speaker 106. In such embodiments, conventional overcurrent protection is designed to detect an output current in excess of a threshold for which the circuit 100 shuts down to avoid damage to the device and other components such as the speaker 106. For example, when the output is shorted to ground 108, as illustrated in FIG. 1A, a large output current 110 is generated. The overcurrent protection feature detects this large output current 110 and shuts down the amplifier 100 if the output current 110 reaches the output current threshold set for the circuit 100.

When considering the dynamic behavior of a loudspeaker, however, it may be desirable to keep the circuit 100 operational to avoid an audible interruption in the output audio if the output current exceeds an output current threshold as a result of an impedance drop across the speaker 106, as opposed to a short-circuit condition. Thus, if the output current reaches or exceeds the output current threshold due to an impedance drop across the speaker 106 (see FIG. 1B), the output current 110' is limited to a preset value to avoid shutting down the device 100, and the amplifier 102 continues switching to avoid an audible interruption in the output audio. This is known as current limiting.

It is often difficult to accurately distinguish between a short-circuit condition and an impedance drop using conventional overcurrent protection circuitry. Therefore, there exists a need for an overcurrent protection circuit capable of more accurately distinguishing between a short-circuit condition and an impedance drop and implementing appropriate protective measures in response thereto.

SUMMARY

The present disclosure provides a system for providing overcurrent protection in a class-D audio amplifier circuit, the class-D audio amplifier circuit having a first drive channel and a second drive channel, the system comprising: first current protection circuitry configured to monitor an output current of the second drive channel and, in response to an overcurrent condition of the second drive channel, to drive an output signal of the first drive channel to the same state as an output signal of the second drive channel; and shutdown circuitry configured to shut down the class-D audio amplifier circuit if the output current of the second drive channel reaches a shutdown threshold.

In another embodiment, the present disclosure provides a method for providing overcurrent protection in a class-D audio amplifier circuit having a first drive channel and a second drive channel, the method comprising: monitoring an output current of the second drive channel to detect an overcurrent condition of the second drive channel; driving an output signal of the first drive channel to the same state as an output signal of the second drive channel if the overcurrent condition of the second drive channel is detected; monitoring the output current of the second drive channel to detect a shutdown condition of the second drive channel; and shutting down the class-D audio amplifier circuit if the shutdown condition of the second drive channel is detected.

In yet another embodiment, the present disclosure provides a circuit comprising: a first half-bridge drive circuit configured to output a first drive signal to a load; a first current sensor configured to sense a first current of the first drive signal; a second half-bridge drive circuit configured to output a second drive signal to said load; an overcurrent protection circuit configured to compare the sensed first current to a first threshold and cause the second half-bridge drive circuit to output the second drive signal with a same logic state as the first drive signal if the first threshold is exceeded; and a shutdown circuit configured to compare the sensed first current to a second, higher threshold and cause a circuit shutdown if the second threshold is exceeded.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which:

FIG. 5C illustrates example waveforms corresponding to operation of the example overcurrent protection circuit illustrated in FIG. 2 during a short-circuit condition;

FIGS. 9A and 9B illustrate example waveforms corresponding to operation of the overcurrent protection circuit of FIG. 6.

DETAILED DESCRIPTION OF THE EMBODIMENTS

Figure 1A:
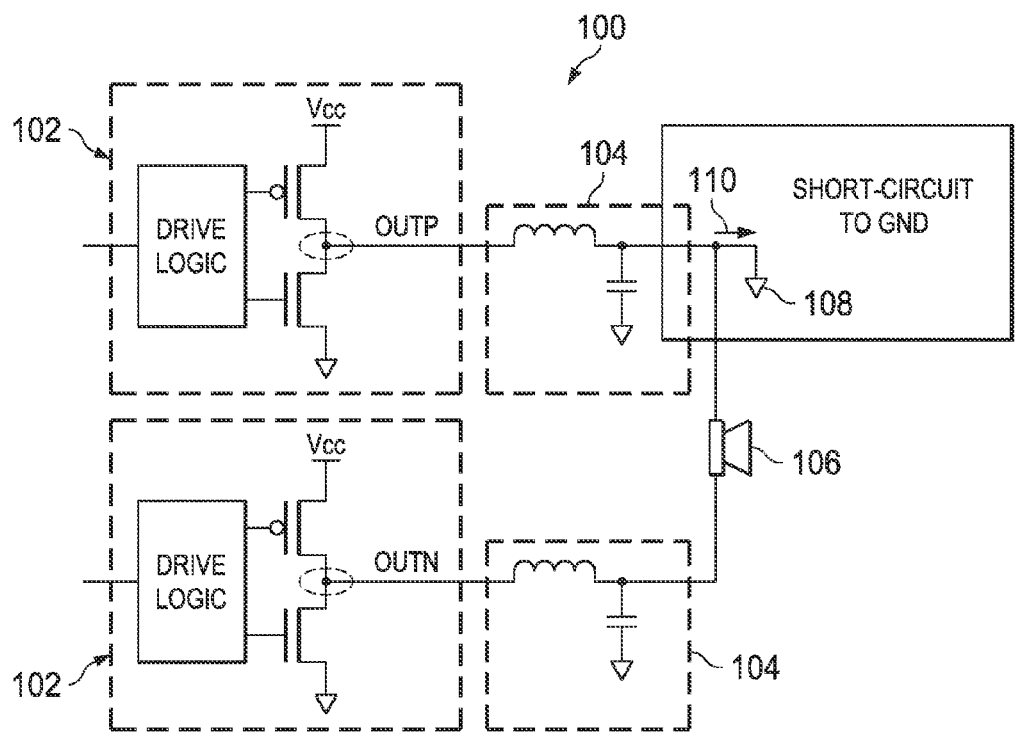
FIGS. 1A and 1B illustrate example overcurrent conditions experienced in an example class-D audio amplifier circuit.
Figure 1B:
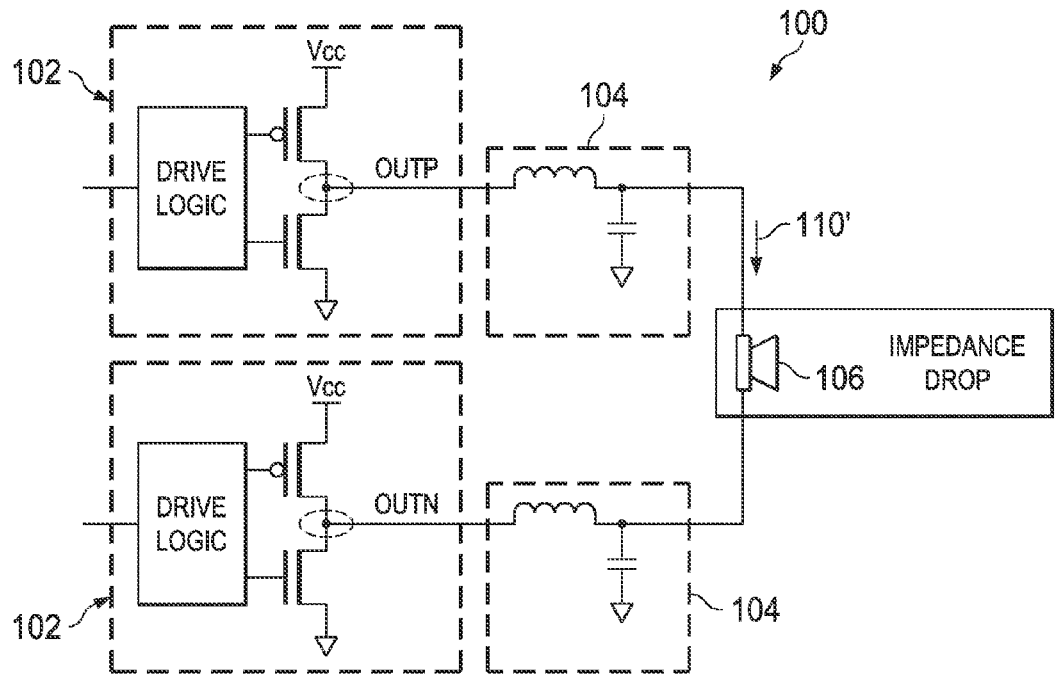
Figure 2:
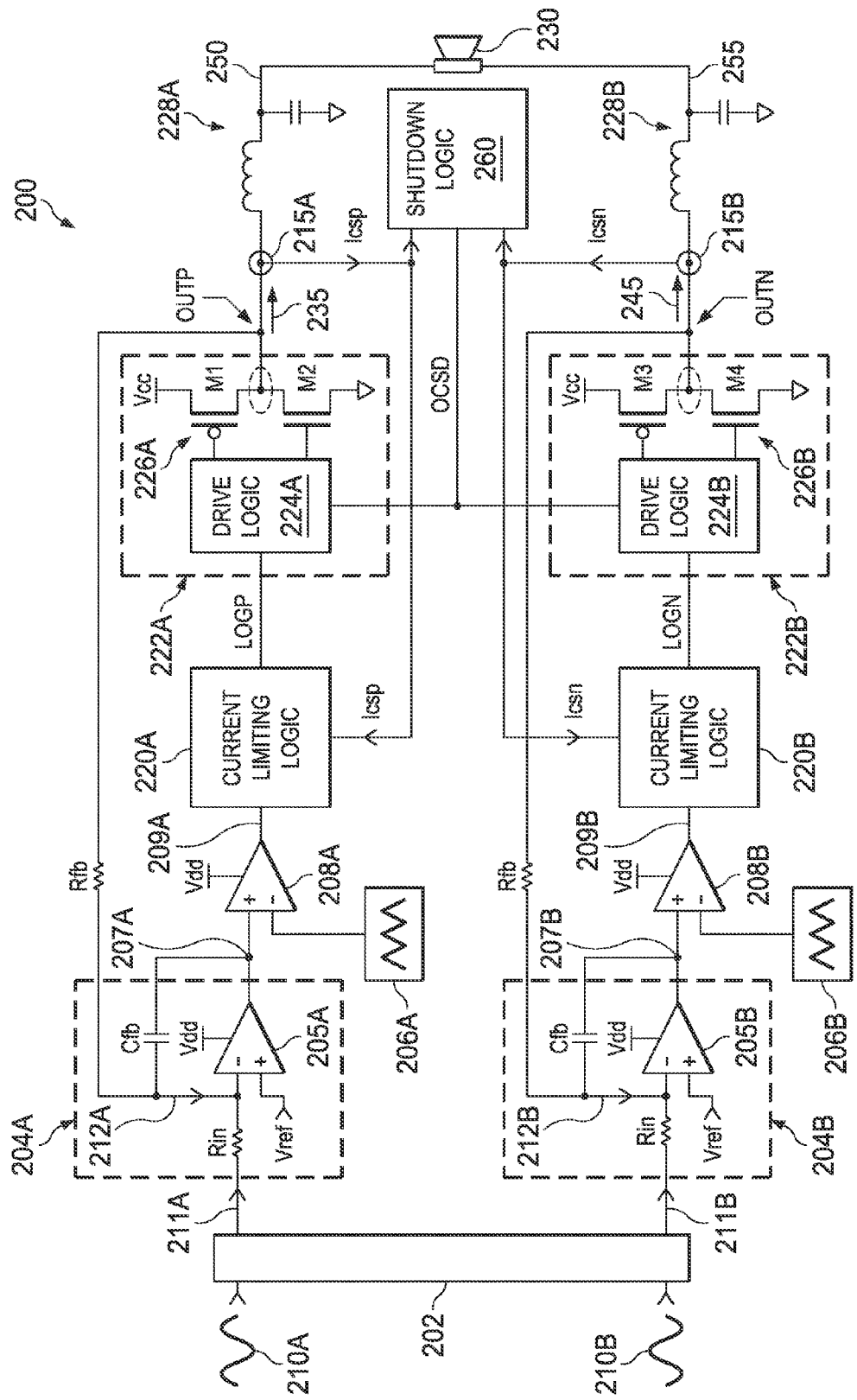
FIG. 2 illustrates an example embodiment of a class-D audio amplifier circuit incorporating an overcurrent protection circuit that implements two output current thresholds and same-channel monitoring.

Reference is now made to FIG. 2, which illustrates an example embodiment of a BTL class-D amplifier circuit 200. The circuit 200 has a differential architecture including a differential amplifier 202 configured to receive differential input signals 210A and 210B and output differential output signals 211A and 211B. The first output signal 211A is processed through a first drive channel to drive a first terminal of speaker 230. The second output signal 211B is processed through a second drive channel to drive a second terminal of speaker 230. Each drive channel includes: integration circuitry 204A or 204B, waveform generator circuitry 206A or 206B, comparators 208A or 208B, current limiting logic 220A or 220B, switching amplifier circuitry 222A or 222B, and a low-pass filter 228A or 228B. As illustrated in FIG. 2, elements labeled with a number followed by the letter "A" correspond to the first ("positive") drive channel, which produces output signal OUTP. Similarly, elements labeled with a number followed by the letter "B" correspond to the second ("negative") drive channel, which produces output signal OUTN.

In operation, the differential amplifier 202 receives positive input signal 210A and negative input signal 210B, and produces differential output signals 211A and 211B, which are filtered by the integration circuitry 204A and 204B. Integration circuitry 204A includes an amplifier 205A which receives, at its negative input terminal, the differential output signal 211A and feedback input 212A from the output signal 235, and receives, at its positive input terminal, a reference voltage Vref. Integration circuitry 204A produces a filtered signal 207A that is representative of the positive audio input to the circuit 200. Similarly, integration circuitry 204B includes an amplifier 205B which receives, at its negative input terminal, the differential output signal 211B and feedback input 212B from the output signal 245, and receives, at its positive input terminal, a reference voltage Vref. Integration circuitry 204B produces a filtered signal 207B that is representative of the negative audio input to the circuit 200.

Drive channel output signals OUTP and OUTN are ultimately determined by a comparison of the filtered signals 207A and 207B received from respective integration circuitry 204A and 204B, respectively, and the triangle waveforms produced by the waveform generator circuitry 206A and 206B. Regarding OUTP, comparator 208A compares the filtered positive channel input signal 207A to the triangle waveform generated by 206A, and produces a pulse width modulated (PWM) signal 209A having a duty cycle that is directly proportional to the instantaneous value of the input signal 207A. PWM signal 209A is then fed into the current limiting logic 220A. Regarding OUTN, comparator 208B compares the filtered negative channel input signal 207B to the triangle waveform generated by 206B, and produces PWM signal 209B having a duty cycle that is directly proportional to the instantaneous value of the input signal 207B. PWM signal 209B is then fed into the current limiting logic 220B.

Figure 3A:
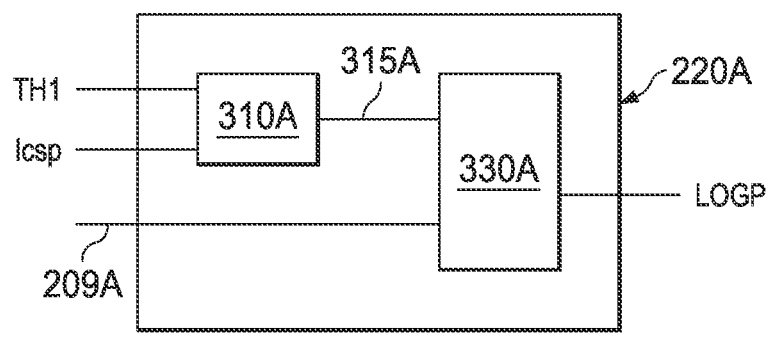
FIGS. 3A and 3B illustrate example block diagrams of circuitry comprising the current limiting logic illustrated in FIG. 2.

The current limiting logic 220A and 220B are now discussed with reference to FIGS. 3A and 3B. Referring to FIG. 3A, the current limiting logic 220A receives PWM signal 209A, a first threshold value TH1 and a sensing current Ics. The sensing current Icsp is generated by current sensing circuitry 215A (see FIG. 2) coupled to the output of the switched amplifier circuitry 222A to sense the output current 235 of OUTP. The sensing current Icsp, which is indicative of the OUTP current 235, is compared to the first threshold TH1 at comparison circuitry 310A. The comparison circuitry 310A outputs a current limit signal 315A that is low if the sensing current Icsp is less than the first threshold TH1, and is high if the sensing current Icsp is equal to, or greater than, the first threshold TH1. Thus, the current limit signal 315A is logic high when the first threshold TH1 is exceeded, this being indicative, for example, of an overcurrent condition existing at the positive channel output OUTP.

The current limiting logic 220A also includes output circuitry 330A, which receives the PWM signal 209A and current limit signal 315A, and produces an output signal LOGP for driving the switching amplifier 222A in accordance with the comparisons of the sensing current Icsp to the threshold TH1. For example, when current limit signal 315A is low, the output signal LOGP is equal to the PWM signal 209A. When the current limit signal 315A is high, the output signal OUTP is reset low. Thus, the current limiting logic 220A drives the switching amplifier 222A such that the output current 235 is limited to a value not to exceed the first threshold TH1.

Figure 3B:
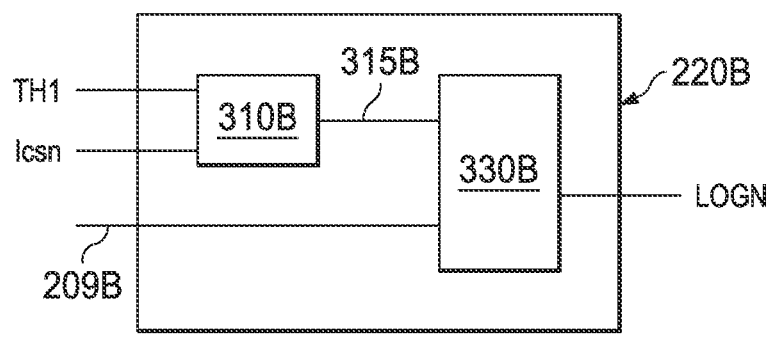

Referring now to FIG. 3B, the current limiting logic 220B receives PWM signal 209B, the first threshold value TH1, and a sensing current Icsn. The sensing current Icsn is generated by current sensing circuitry 215B (see FIG. 2) coupled to the output of the switched amplifier circuitry 222B to sense the output current 245 of OUTN. The sensing current Icsn, which is indicative of the OUTN current 245, is compared to the first threshold TH1 at comparison circuitry 310B, which outputs a current limit signal 315B that is low if the sensing current Icsn is less than the first threshold TH1, and is high if the sensing current Icsn is equal to, or greater than, the first threshold TH1. Thus, the current limit signal 315B is logic high when the first threshold TH1 is exceeded, this being indicative, for example, of an overcurrent condition existing at the negative channel output OUTN.

The current limiting logic 220B also includes output circuitry 330B, which receives the PWM signal 209B and current limit signal 315B, and produces an output signal LOGN for driving the switching amplifier 222B in accordance with the comparisons of the sensing current Icsn to the threshold TH1. For example, when the current limit signal 315B is low, the output signal LOGN is equal to the PWM signal 209B. When the current limit signal 315B is high, the output signal OUTN is reset low. Thus, the current limiting logic 220B drives the switching amplifier 222B such that the output current 245 is limited to a value not to exceed the first threshold TH1.

Referring again to FIG. 2, output signal LOGP drives the switching amplifier circuitry 222A to produce output signal OUTP, which is an amplified version of the PWM signal 209A. The switching amplifier circuitry 222A includes drive logic circuitry 224A and a half-bridge drive circuit 226A having high-side transistor M1 and low-side transistor M2, and is configured to produce the output signal OUTP with an output current 235. Similarly, output signal LOGN drives the switching amplifier circuitry 222B to produce output signal OUTN, which is an amplified version of the PWM signal 209B. Switching amplifier circuitry 222B includes drive logic circuitry 224B and a half-bridge drive circuit 226B having high-side transistor M3 and low-side transistor M4, and is configured to produce the output signal OUTN with an output current 245. Output signals OUTP and OUTN are filtered by low-pass filters 228A and 228B, respectively, to generate respective audio output signals 250 and 255 received at the opposite terminals of the output speaker 230.

Figure 4:
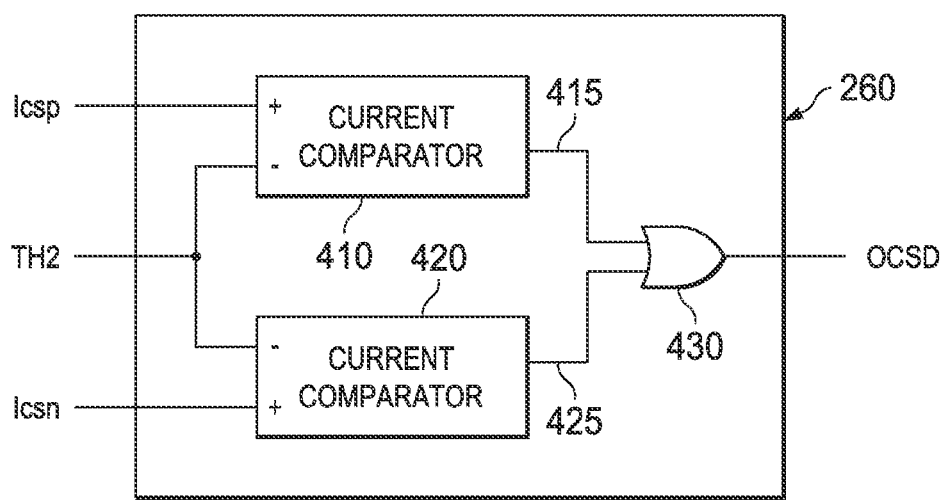
FIG. 4 illustrates example circuitry comprising the shutdown logic illustrated in FIG. 2.

The amplifier circuit 200 also includes shutdown logic 260, which compares the sensing current Icsp and Icsn to a second threshold TH2 to detect a short-circuit condition or other overcurrent condition to trigger shutdown of the circuit 200. The shutdown logic 260 is now described with reference to FIG. 4. The shutdown logic 260 receives sensing currents Icsp and Icsn and second threshold TH2, and produces an output signal OCSD. Sensing current Icsp is compared to the second threshold TH2 at a first current comparator 410. The first current comparator 410 outputs a shutdown signal 415 that is low if the sensing current Icsp is less than the second threshold TH2, and is high if the sensing current Icsp is equal to, or greater than, the second threshold TH2. Sensing current Icsn is compared to the second threshold TH2 at a second current comparator 420. The second current comparator 420 outputs a shutdown signal 425 that is low if the sensing current Icsn is less than the second threshold TH2, and is high if the sensing current Icsn is equal to, or greater than, the second threshold TH2. Shutdown signals 415 and 425 are received at OR gate 430. OR gate 430 outputs a shutdown signal OCSD that is low if shutdown signals 415 and 425 are low, and is high if either (or both) shutdown signals 415 or 425 are high. Thus, shutdown signal OCSD is logic high when the second threshold TH2 is exceeded by either the sensing current Icsp or sensing current Icsn, this being indicative, for example, of a short-circuit condition existing at either the positive channel output OUTP or the negative channel output OUTN, respectively.

Referring again to FIG. 2, shutdown signal OCSD is received at the drive logic 224A and 224B. When the shutdown signal OCSD is high, drive logic 224A pulls the gate of transistor M1 up to Vcc and the gate of transistor M2 down to ground, and drive logic 224B pulls the gate of transistor M3 up to Vcc and the gate of transistor M4 down to ground, thereby inhibiting the drive logic 224A and 224B and forcing the outputs to the high-impedance state, thus, effectively shutting down both channels of the circuit 200 simultaneously.

In the embodiment illustrated in FIG. 2, the overcurrent protection circuitry (current limiting logic 220A, 220B, and shutdown logic 260) implements two overcurrent thresholds and same-channel monitoring to avoid a dynamic impedance drop. The first threshold TH1 is an overcurrent limit used to detect an overcurrent condition to trigger drive reduction of the circuit 200. If the output current reaches the first threshold (also referred to herein as the current limiting threshold), the circuit 200 may have experienced an overcurrent condition as a result of an impedance drop across the speaker 230, and the overcurrent protection circuitry 220 limits the output current to a value which does not exceed the first threshold, but does not shut down the circuit 200. The second threshold TH2 (also referred to herein as the shut-down threshold) is used to detect a short-circuit condition or other overcurrent condition to trigger shutdown of the circuit 200. If the output current reaches the second threshold TH2, the circuit 200 is presumed to be shorted and is, therefore, shut down.

Same-channel monitoring refers to the circuit configuration whereby current limiting logic 220A and 220B each monitor the output current of their respective drive channel, and reset low the output signal for their own channel if an overcurrent condition exists for its respective channel. In other words, current limiting logic 220A monitors the positive drive channel output current 235 and resets low the output signal OUTP if an overcurrent condition is detected. Current limiting logic 220B monitors the negative drive channel output current 245 and resets low the output signal OUTN if an overcurrent condition is detected.

Figure 5A:
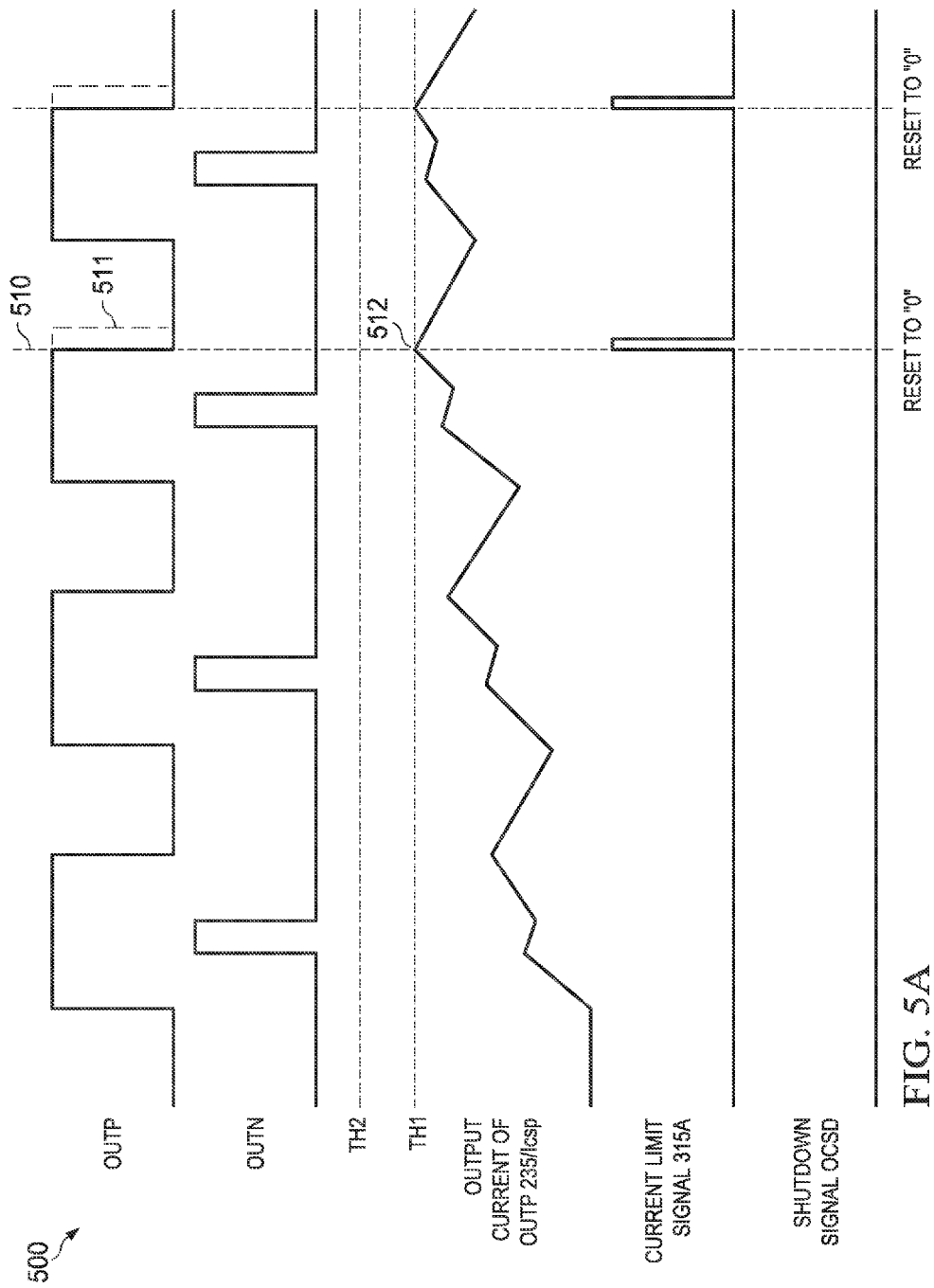
FIGS. 5A and 5B illustrate example waveforms corresponding to operation of the example overcurrent protection circuit illustrated in FIG. 2 during an overcurrent condition caused by an impedance drop.

Operation of the current limiting logic 220A is now discussed in greater detail with reference to representative waveforms 500 illustrated in FIG. 5A. The voltage across the speaker 230 equals OUTP–OUTN. Therefore, when OUTP is high and OUTN is low, output current 235 (and current sense signal Ics) increases. When OUTP and OUTN are both high, or both low, the voltage across the speaker 230 is zero, and the output current 235 decreases.

When the output current 235 is less than the current limiting threshold TH1, the current limiting logic 220A drives the drive logic 224A, which in turn drives the half-bridge drive circuit 226A to produce OUTP. At reference 510, the output current 235 reaches the current limiting threshold TH1, and current limit signal 315A goes high. When the current limit signal 315A is high, OUTP is reset low for the remainder of the PWM cycle (see, dotted reference 511). When OUTP is reset low, the voltage across the speaker 230 is reduced to zero, thereby reducing the output current 235 below the current limiting threshold TH1 (reference 512). Thus, when the circuit 200 experiences an overcurrent condition as a result of an impedance drop across the speaker 230, the current limiting circuitry 220A drives the drive logic 224A and, in turn, switches 226A, such that the output current 235 of OUTP is limited to the value of the current limiting threshold TH1. Although it is not illustrated, if the output current 235 reaches the shut-down threshold TH2, the shutdown signal OCSD produced by the shutdown logic 260 goes high, and triggers a shutdown of the amplifier circuit 200.

Figure 5B:
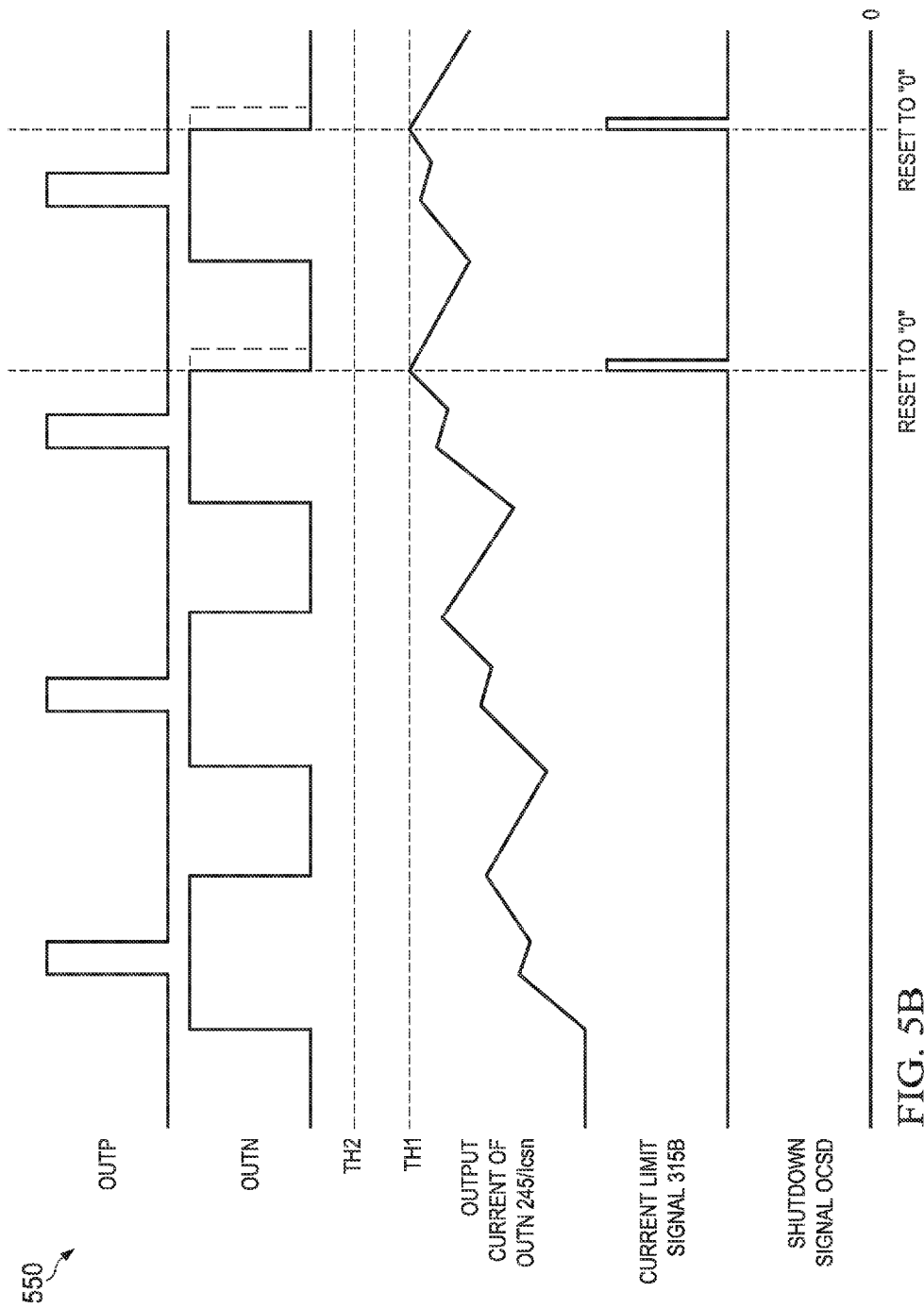

It should be appreciated that the current limiting logic 220B operates similar to the current limiting logic 220A discussed above. See FIG. 5B for example waveforms 550 corresponding to operation of the current limiting logic 220B in accordance with the foregoing disclosure.

In the example class-D amplifier circuit embodiment illustrated in FIG. 2, a true short-circuit condition may be masked by the circuit's inability to recognize the short-circuit condition, and thus, the circuit 200 is often unable to shut down in the event of a short-circuit condition. For example, with reference to the waveforms 555 illustrated in FIG. 5C, OUTP is shorted at reference 515, thereby causing output current 235 to spike when OUTP is high (reference 516). Because of the shorted condition, the output current 235 rises to the first threshold TH1 for each OUTP cycle, causing the current limit signal 315A to go high, thereby resetting OUTP low for each cycle (reference 517). When OUTP goes high again, the output current 235 again spikes to the first threshold TH1, and the current limit signal 315A again triggers the reset of OUTP before the shutdown signal OCSD can be triggered. As a result, the output current 235 is repeatedly limited to the first threshold TH1 and, therefore, cannot reach the second threshold TH2 to trigger the shutdown signal OCSD to cause the circuit 200 to shut down, even though the circuit 200 is experiencing a short-circuit condition.

Figure 6:
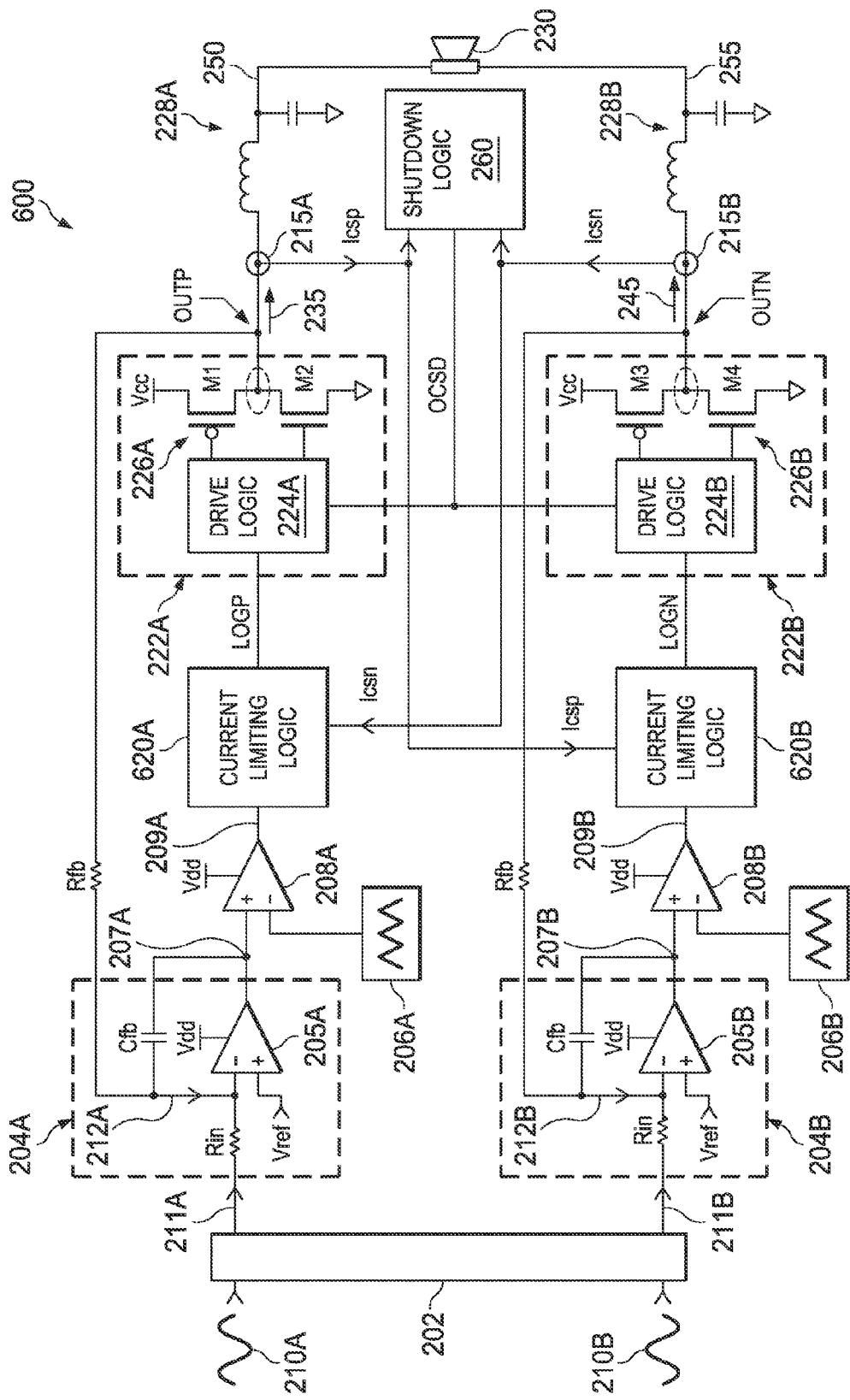
FIG. 6 illustrates a class-D audio amplifier circuit incorporating an overcurrent protection circuit that implements two output current thresholds and opposite-channel monitoring.

Reference is now made to FIG. 6, which illustrates an example of a BTL class-D audio amplifier circuit 600 incorporating an overcurrent protection scheme in accordance with an example embodiment of the present disclosure. The amplifier circuit 600 includes circuitry similar to that provided in FIG. 2 and discussed above, wherein like reference numbers indicate similar parts.

Figure 7A:
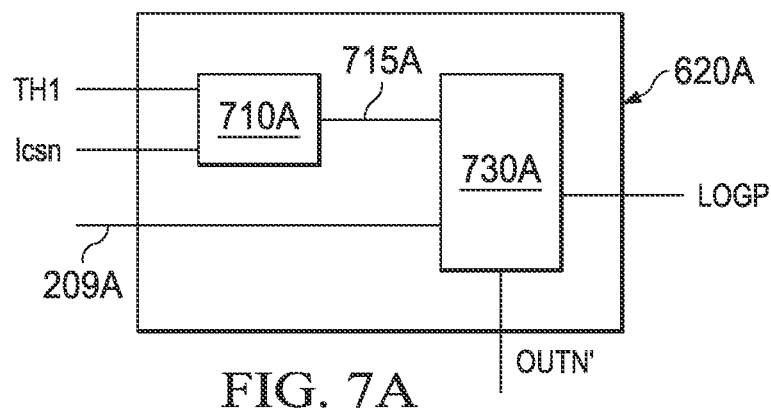
FIGS. 7A and 7B illustrate example block diagrams of circuitry comprising the current limiting logic illustrated in FIG. 6.

The amplifier circuit 600 replaces the current limiting logic 220A and 220B of FIG. 2 with current limiting logic 620A and 620B, which are now discussed with reference to FIGS. 6, 7A, and 7B. As shown in FIGS. 6 and 7A, the current limiting logic 620A receives PWM signal 209A, first threshold value TH1, representative output signal OUTN', and sensing current Icsn. The representative output signal OUTN' is indicative of the logic state of output signal OUTN. The sensing current Icsn is generated by current sensing circuitry 215B coupled to the output of the switched amplifier circuitry 222B to sense the negative channel output signal current 245. The sensing current Icsn, which is indicative of the OUTN current 245, is compared to the first threshold TH1 at comparison circuitry 710A. The comparison circuitry 710A outputs a current limit signal 715A that is low if the sensing current Icsn is less than the first threshold TH1, and is high if the sensing current Icsn is equal to, or greater than, the first threshold TH1. Thus, the current limit signal 715A is logic high when the first threshold TH1 is exceeded, this being indicative, for example, of an overcurrent condition existing at the negative channel output OUTN.

Output circuitry 730A receives the PWM signal 209A, current limit signal 715A, and representative output signal OUTN', and produces an output signal LOGP for driving the switching amplifier 222A to control the output signal OUTP in response to the current limit signal 715A. Thus, the current limiting logic 620A of the positive drive channel controls the positive channel output signal OUTP in response to the negative drive channel output current 245.

Figure 7B:
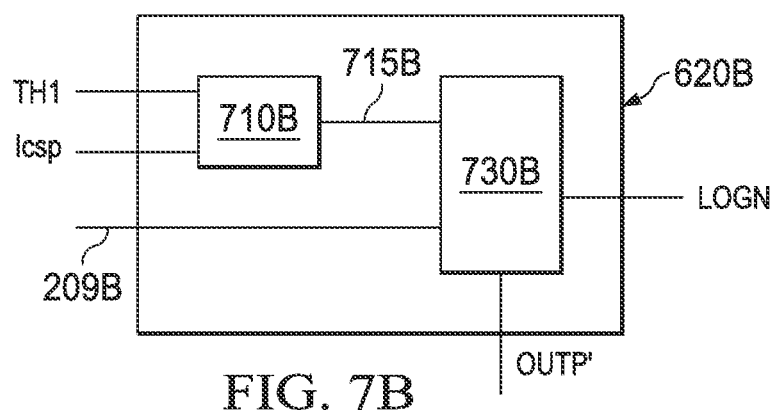

As shown in FIGS. 6 and 7B, the current limiting logic 620B receives PWM signal 209B, first threshold value TH1, representative output signal OUTP', and sensing current Icsp. The representative output signal OUTP' is indicative of the logic state of output signal OUTP. The sensing current Icsp is generated by current sensing circuitry 215A coupled to the output of the switched amplifier circuitry 222A to sense the positive output current signal current 235. The sensing current Icsp, which is indicative of the OUTP current 235, is compared to the first threshold TH1 at comparison circuitry 710B. The comparison circuitry 710B outputs a current limit signal 715B that is low if the sensing current Icsp is less than the first threshold TH1, and is high if the sensing current Icsp is equal to, or greater than, the first threshold TH1. Thus, the current limit signal 715B is logic high when the first threshold TH1 is exceeded, this being indicative, for example, of an overcurrent condition existing at the positive channel output OUTP.

Output circuitry 730B receives the PWM signal 209B, current limit signal 715B, and representative output signal OUTP', and produces an output signal LOGN for driving the switching amplifier 222B to control the output signal OUTN in response to the current limit signal 715B. Thus, the current limiting logic 620B of the negative drive channel controls the negative channel output signal OUTN in response to the positive drive channel output current 235.

Figure 8A:
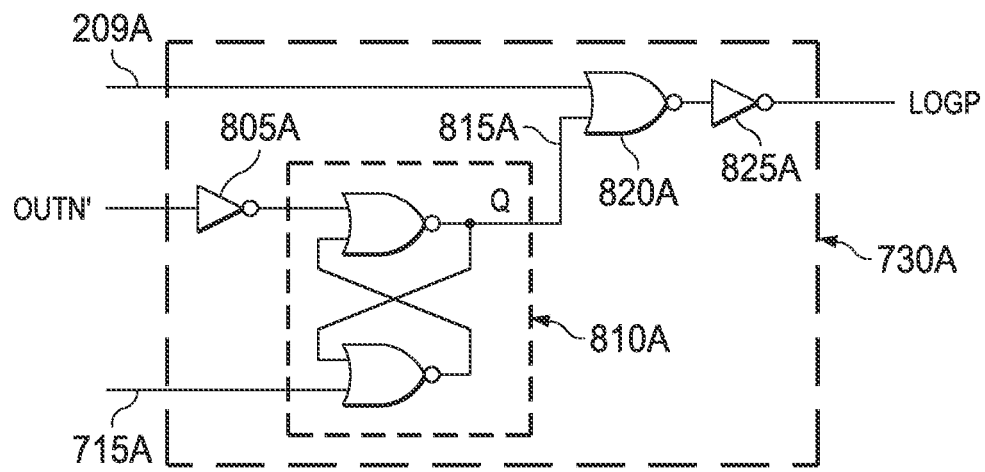
FIGS. 8A and 8B illustrate example embodiments of the current limiting logic circuitry of FIGS. 7A and 7B.

Referring now to FIG. 8A, an example embodiment of circuitry comprising the output circuitry 730A is shown. Representative output signal OUTN' is inverted at NOT gate 805A and then passed to the reset input of a NOR latch 810A. Current limit signal 715A is received at the set input of the NOR latch 810A. NOR gate 820A receives the NOR latch output 815A at a first input and receives PWM signal 209A at the other input. The output of NOR gate 820A is inverted by NOT gate 825A and output as current limiting logic output signal LOGP.

In operation, when the negative drive channel output current 245 is below the first threshold TH1 (i.e., current limit signal 715A is low), NOR latch output 815A is low, and PWM signal 209A is output as LOGP (via NOR gate 820A and inverter 825A) regardless of the state of output signal OUTN. When the output current 245 is greater than, or equal to, the first threshold TH1 (i.e., current limit signal 715A is high), the NOR latch output 815A is high. Accordingly, the NOR gate 820A outputs a low state which is then inverted by NOT gate 825A, and the output signal LOGP is driven high so as to drive OUTP to a high state. Note that, in this overcurrent condition, the negative channel output OUTN is not reset low. Rather, the positive channel output OUTP is driven high.

Figure 8B:
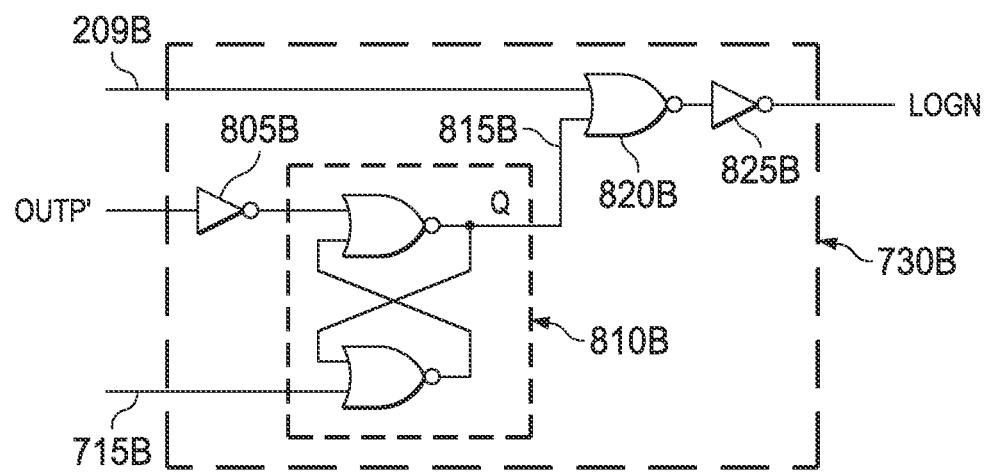

Referring now to FIG. 8B, an example embodiment of circuitry comprising the output circuitry 730B is shown. Representative output signal OUTP' is inverted at NOT gate 805B and then passed to the reset input of NOR latch 810B. Current limit signal 715B is received at the set input of the NOR latch 810B. NOR gate 820B receives the NOR latch output 815B at a first input and receives PWM signal 209B at the other input. The output of NOR gate 820B is inverted by NOT gate 825B and output as the current limiting logic output signal LOGN.

In operation, when the positive drive channel output current 235 is below the first threshold TH1 (i.e., current limit signal 715B is low), NOR latch output 815B is low, and PWM signal 209B is output as LOGN (via NOR gate 820B and inverter 825B) regardless of the state of output signal OUTP. When the output current 235 is greater than, or equal to, the first threshold TH1 (i.e., current limit signal 715B is high), the NOR latch output 815B is high. Accordingly, the NOR gate 820B outputs a low state which is then inverted by NOT gate 825B, and the output signal LOGN is driven high so as to drive OUTN to a high state. Note that, in this overcurrent condition, the positive channel output OUTP is not reset low. Rather, the negative channel output OUTN is driven high.

In the embodiment illustrated in FIG. 6, the overcurrent protection circuitry (current limiting logic 620A, 620B, and shutdown logic 260) implements two overcurrent thresholds and opposite-channel monitoring to avoid a dynamic impedance drop. The first threshold TH1 is an overcurrent limit used to detect an overcurrent condition to trigger drive reduction of the circuit 600. The second threshold TH2 is used to detect a short-circuit condition or other overcurrent condition to trigger shutdown of the circuit 600. Opposite-channel monitoring refers to the circuit configuration whereby the current limiting logic of a given channel monitors the overcurrent condition of the opposite channel, and sets high the output signal for its own channel if an overcurrent condition exists for the opposite channel. For purposes of this disclosure, it should be understood that an overcurrent condition exists if the output current 235 or 245 reaches at least the first threshold value TH1.

The current limiting logic 620A monitors the overcurrent condition of the negative channel output OUTN by comparing the current sense signal Icsn to the first threshold and controlling the positive channel output OUTP in response thereto. If the current sense signal Icsn is greater than, or equal to, the first threshold TH1, the current limit signal 715A is set logic high and the current limiting logic 620A sets the positive channel output OUTP to logic high.

When current limit signal 715A is high, an overcurrent condition exists at the negative channel output OUTN. When this occurs, OUTN remains high, and LOGP is set logic high to cause OUTP to go high as well. If OUTN is shorted (e.g., to ground), the OUTN output current 245 will quickly rise from the first threshold to the second threshold, and the device 600 will be shut down. If the current limit signal 715A is generated as the result of an impedance drop across the speaker 230, then the OUTN output current 245 will not rise because the voltage drop across the speaker 230 will be zero (OUTN−OUTP=0), and the device 600 will continue to operate.

Conversely, the current limiting logic 620B monitors the overcurrent condition of the positive channel output OUTP by comparing the current sense signal Icsp to the first threshold and controlling the negative channel output OUTN in response thereto. If the current sense signal Icsp is greater than, or equal to, the first threshold TH1, the current limit signal 715B is set logic high and the current limiting logic 620B sets the negative channel output OUTN to logic high.

When current limit signal 715B is high, an overcurrent condition exists at the positive channel output OUTP. When current limit signal 715B is high, OUTP is also high, and LOGN is set high to cause OUTN to go high as well. If OUTP is shorted (e.g., to ground), the OUTP output current 235 will immediately rise from the first threshold TH1 to the second threshold TH2, and the device 600 will be shut down. If the current limit signal 715B is generated as the result of an impedance drop across the speaker 230, then the OUTP output current 235 will not rise because the voltage drop across the speaker 230 will be zero (OUTP−OUTN=0), and the device 600 will continue to operate.

This overcurrent protection scheme whereby the current limiting logic of a first channel monitors the overcurrent condition of the second channel and controls the first channel output in response thereto serves, in effect, to permit the output current of the second channel to spike beyond the first threshold TH1 to the second threshold TH2 if the circuit 600 is experiencing a short-circuit condition. Furthermore, this overcurrent protection scheme also allows the output current of the second channel to drop below the first threshold TH1 if the overcurrent condition of the second channel is caused by an impedance drop across the output speaker 230, so that the device 600 can continue to operate.

Reference is now made to FIG. 9A, which illustrates example waveforms 900 corresponding to various components of the amplifier circuit 600 during a short-circuit overcurrent condition. The waveforms 900 illustrated in FIG. 9A are used to describe operation of the current limiting logic 620B (and shutdown logic 260), however, it should be appreciated that the current limiting logic 620A operates in a similar manner. In the example illustrated in FIG. 9A, the positive channel output OUTP is shorted to ground at reference 905. Therefore, when OUTP goes high, output current 235 spikes (reference 906). When the OUTP output current 235 reaches the first threshold TH1, overcurrent limit signal 715B goes high at reference 910. When the overcurrent limit signal 715B goes high, OUTP remains high, and current limiting logic output signal LOGN goes high, causing OUTN to go high, as shown in FIG. 9A.

The voltage across the speaker 230 equals OUTP−OUTN, which, in normal conditions, is zero. But, because OUTP is shorted to ground and OUTP remains in a logic high state, the output current 235 continues to rise until it reaches the second threshold TH2. At this point (reference 907), the shutdown signal OCSD is set at reference 915, and the amplifier circuit 600 is shut down to protect against the short-circuit, overcurrent condition.

Figure 9B:
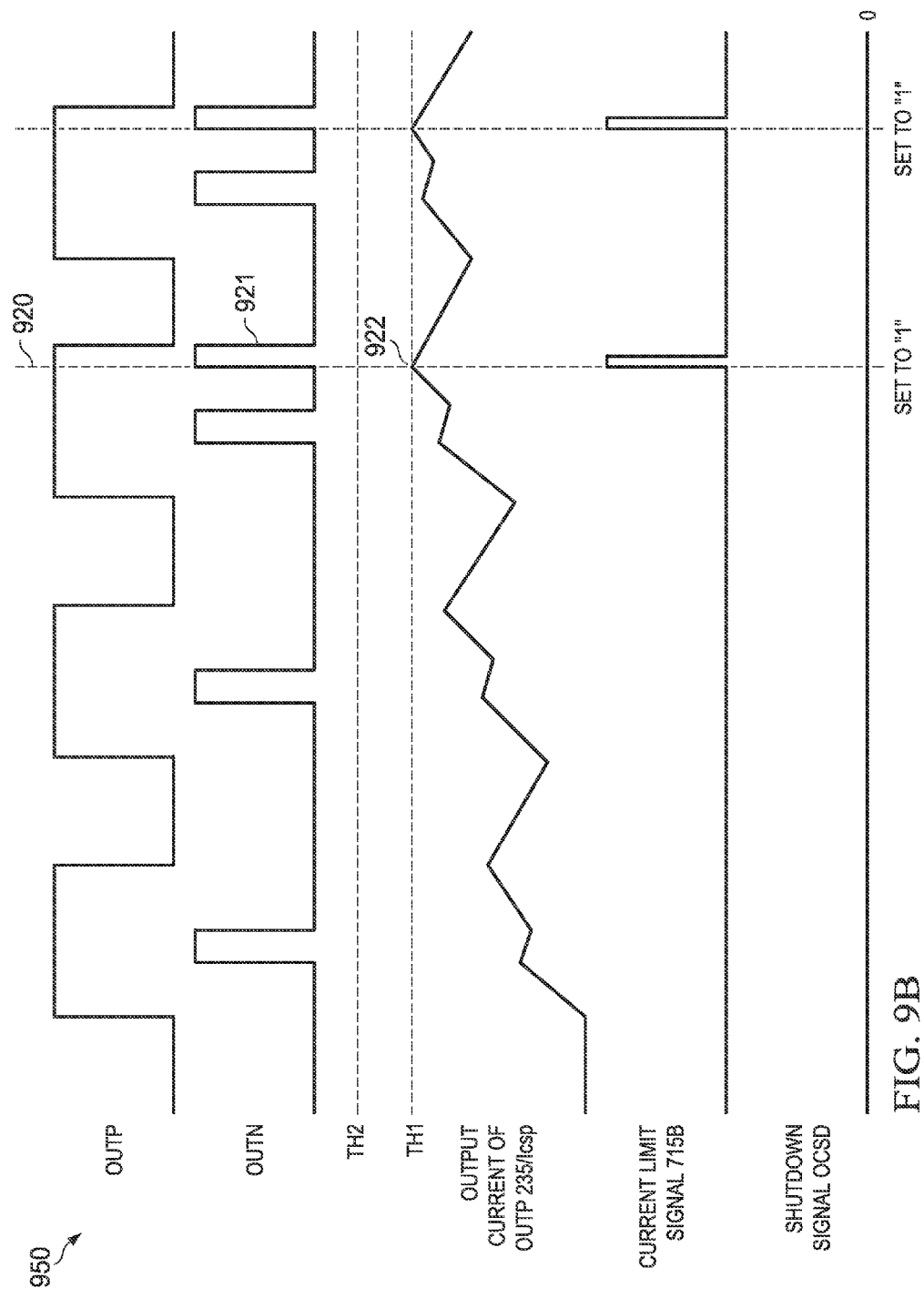

Reference is now made to FIG. 9B, which illustrates example waveforms 950 corresponding to various components of the amplifier circuit 600 during an overcurrent condition caused by an impedance drop across the speaker 230. The waveforms 950 illustrated in FIG. 9B are used to describe operation of the current limiting logic 620B (and shutdown logic 260), however, it should again be understood that the current limiting logic 620A operates in a similar manner. In the example illustrated in FIG. 9B, the OUTP output current 235 continues to rise as the circuit 600 operates. At reference 920, the output current 235 reaches the first threshold TH1, which triggers the current limit signal 715B to rise (reference 920). When the overcurrent limit signal 715B goes high, OUTP remains high, and current limiting logic output signal LOGN goes high, causing OUTN to go high, as shown in FIG. 9B at reference 921. Because the overcurrent condition occurred as a result of the impedance drop across the speaker 230 (and not a short-circuit condition), OUTP is equal to OUTN, and the voltage drop across the speaker 230 is zero. As such, the output current 235 begins to decrease (reference 922) below the threshold TH1 and, as the circuit 600 continues to operate, is again limited to the first threshold value TH1 in subsequent cycles.

The proposed overcurrent protection scheme is capable of accurately distinguishing between a short-circuit condition and an impedance drop and implementing appropriate protective measures to permit the class-D audio amplifier to either continue operation if the overcurrent condition is the result of an impedance drop, or to shut down if the overcurrent condition is a result of a short-circuit condition.

The disclosed overcurrent protection circuitry is generally discussed in connection with short-circuit conditions occurring as a short-circuit to ground. However, it should be appreciated that the disclosed overcurrent protection circuitry may also be used to protect from an overcurrent condition occurring as a result of a short-circuit to Vcc.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A system for providing overcurrent protection in a class-D audio amplifier circuit, the class-D audio amplifier circuit having a first drive channel and a second drive channel, the system comprising:
   first current protection circuitry configured to monitor an output current of the second drive channel and, in response to an overcurrent condition of the second drive channel, to drive an output signal of the first drive channel to the same state as an output signal of the second drive channel; and
   shutdown circuitry configured to shut down the class-D audio amplifier circuit if the output current of the second drive channel reaches a shutdown threshold.

2. The system of claim 1, wherein the first current protection circuitry comprises:
   first overcurrent detection circuitry operable to detect an overcurrent condition by comparing the output current of the second drive channel to a first overcurrent threshold and generating a first current limit signal if the output current of the second drive channel reaches the first overcurrent threshold; and
   first output circuitry operable, in response to the first current limit signal, to generate a first drive signal for driving the output signal of the first drive channel to the same state as the output signal of the second drive channel.

3. The system of claim 1, wherein the shutdown circuitry comprises:

first comparator circuitry operable to compare the output current of the second drive channel to the shutdown threshold and to generate a shutdown signal if the output current of the second drive channel reaches the shutdown threshold.

4. The system of claim 1, wherein the first drive channel further comprises first filtering circuitry, a first comparator operable to generate a pulse width modulated signal indicative of a filtered first input signal, and first switching amplifier circuitry operable to control the first channel output signal in response to a first drive signal generated by the first current protection circuitry.

5. The system of claim 4, wherein the first switching amplifier circuitry includes a first half-bridge drive circuit.

6. The system of claim 1, further comprising:
second current protection circuitry configured to monitor an output current of the first drive channel and, in response to an overcurrent condition of the first drive channel, to drive the output signal of the second drive channel to the same state as the output signal of the first drive channel,
wherein the shutdown circuitry is further configured to shut down the class-D audio amplifier circuit if the output current of the first drive channel reaches the shutdown threshold.

7. The system of claim 6, wherein the second current protection circuitry comprises:
second overcurrent detection circuitry operable to detect an overcurrent condition by comparing the output current of the first drive channel to a second overcurrent threshold and generating a second current limit signal if the output current of the first drive channel reaches the second overcurrent threshold; and
second output circuitry operable, in response to the second current limit signal, to generate a second drive signal for driving the output signal of the second drive channel to the same state as the output signal of the first drive channel.

8. The system of claim 6, wherein the shutdown circuitry further comprises:
second comparator circuitry operable to compare the output current of the first drive channel to the shutdown threshold and to generate a second shutdown signal if the output current of the first drive channel reaches the shutdown threshold.

9. The system of claim 6, wherein the first current protection circuitry comprises a portion of the first drive channel, and the second current protection circuitry comprises a portion of the second drive channel.

10. The system of claim 6, wherein the second drive channel further comprises second filtering circuitry, a second comparator operable to generate a pulse width modulated signal indicative of a filtered second input signal, and second switching amplifier circuitry operable to control the second channel output signal in response to a second drive signal generated by the second current protection circuitry.

11. The system of claim 10, wherein the second switching amplifier circuitry includes a second half-bridge drive circuit.

12. A method for providing overcurrent protection in a class-D audio amplifier circuit having a first drive channel and a second drive channel, the method comprising:
monitoring an output current of the second drive channel to detect an overcurrent condition of the second drive channel;
driving an output signal of the first drive channel to the same state as an output signal of the second drive channel if the overcurrent condition of the second drive channel is detected;
monitoring the output current of the second drive channel to detect a shutdown condition of the second drive channel; and
shutting down the class-D audio amplifier circuit if the shutdown condition of the second drive channel is detected.

13. The method of claim 12, wherein monitoring the output current of the second drive channel to detect the overcurrent condition of the second drive channel comprises:
comparing the output current of the second drive channel to a first overcurrent threshold; and
generating a first current limit signal if the output current of the second drive channel reaches the first overcurrent threshold.

14. The method of claim 12, wherein monitoring the output current of the second drive channel to detect the shutdown condition of the second drive channel comprises:
comparing the output current of the second drive channel to a shutdown threshold; and
generating a shutdown signal if the output current of the second drive channel reaches the shutdown threshold.

15. The method of claim 12, further comprising controlling the first channel output signal in response to a first drive signal generated by first current protection circuitry, wherein the first current protection circuitry is operable to monitor the output current of the second drive channel.

16. The method of claim 12, further comprising:
monitoring an output current of the first drive channel to detect an overcurrent condition of the first drive channel;
driving the output signal of the second drive channel to the same state as the output signal of the first drive channel if the overcurrent condition of the first drive channel is detected;
monitoring the output current of the first drive channel to detect a shutdown condition of the first drive channel; and
shutting down the class-D audio amplifier circuit if the shutdown condition of the first drive channel is detected.

17. The method of claim 16, wherein monitoring the output current of the first drive channel to detect the overcurrent condition of the first drive channel comprises:
comparing the output current of the first drive channel to a second overcurrent threshold; and
generating a second current limit signal if the output current of the first drive channel reaches the second overcurrent threshold.

18. The method of claim 16, wherein monitoring the output current of the first drive channel to detect the shutdown condition of the first drive channel comprises:
comparing the output current of the first drive channel to the shutdown threshold; and
generating a second shutdown signal if the output current of the first drive channel reaches the shutdown threshold.

19. The method of claim 16, further comprising controlling the second channel output signal in response to a second drive signal generated by second current protection circuitry, wherein the second current protection circuitry is operable to monitor the output current of the first drive channel.

20. A circuit, the circuit comprising:
a first half-bridge drive circuit configured to output a first drive signal to a load;
a first current sensor configured to sense a first current of the first drive signal;

a second half-bridge drive circuit configured to output a second drive signal to said load;

an overcurrent protection circuit configured to compare the sensed first current to a first threshold and cause the second half-bridge drive circuit to output the second drive signal with a same logic state as the first drive signal if the first threshold is exceeded;

a shutdown circuit configured to compare the sensed first current to a second, higher threshold and cause a circuit shutdown if the second threshold is exceeded.

* * * * *